United States Patent [19]

Aubert

[11] Patent Number: 4,835,504
[45] Date of Patent: May 30, 1989

[54] BLOCK FOR CORRECTING MAGNETIC-FIELD HOMOGENEITY AND A MAGNET FITTED WITH BLOCKS OF THIS TYPE

[75] Inventor: Guy Aubert, Grenoble, France
[73] Assignee: Thomson-CGR, Paris, France
[21] Appl. No.: 48,732
[22] Filed: May 11, 1987

[30] Foreign Application Priority Data

May 13, 1986 [FR] France .................. 86 06862

[51] Int. Cl.⁴ ............................................. H01F 7/00
[52] U.S. Cl. .................................... 335/296; 335/298; 324/320
[58] Field of Search ............... 335/296, 297, 212, 298, 335/306, 304, 299; 324/318, 319, 320

[56] References Cited

U.S. PATENT DOCUMENTS

| | | | |
|---|---|---|---|
| 4,093,912 | 6/1978 | Double et al. | 324/320 |
| 4,350,955 | 9/1982 | Jackson et al. | 324/319 X |
| 4,673,882 | 6/1987 | Buford | 335/298 |
| 4,714,908 | 12/1987 | Watabe et al. | 335/212 |

OTHER PUBLICATIONS

Review of Scientific Instruments, vol. 56, No. 1, Jan. 1985, pp. 131-135, Woodbury, New York, U.S.; D. I. Hoult et al.,: "Shimming a Superconducting Nuclear-Magnetic-Resonance"*Chapter I and II*.
Patents Abstracts of Japan, vol. 9, No. 174 (P-374) [1897], 19 Jul. 1985; & JP-A-A-60 50 442 (Yokokawa Medical System K.K.) 20-03-1985 *Resume*.
Patents Abstracts of Japan, vol. 8, No. 163, (P-290) [1600], 27 Jul. 1984; & JP-A-59 60 346 (Toshiba K.K.) 06-04-1984 "Resume", PCT WO 84/00611, 16 Feb. 1984, W. Oldendorf, Adjustable Magnet Suitable for in Vivo NMR Imaging and Method of Adjusting the Same.

Primary Examiner—George Harris
Attorney, Agent, or Firm—Oblon, Fisher, Spivak, McClelland & Maier

[57] ABSTRACT

A block of magnetized material for adjusting and correcting a magnetic field produced by a magnet provides adjustable correction by modifying the orientation of the magnetic moment of the block with respect to the field. A device which includes an intermediate member rotatably mounted in an orientable support and a fixing member rotatably mounted in the intermediate member makes it possible to orient a preferred direction of the block in a predetermined direction. This results in modification of magnetic disturbances produced by the block in the zone of interest of the magnet. Quantization of pointing of the orientable support is obtained by means of graduated index marks on the support, on the intermeidate member and on the fixing member.

9 Claims, 2 Drawing Sheets

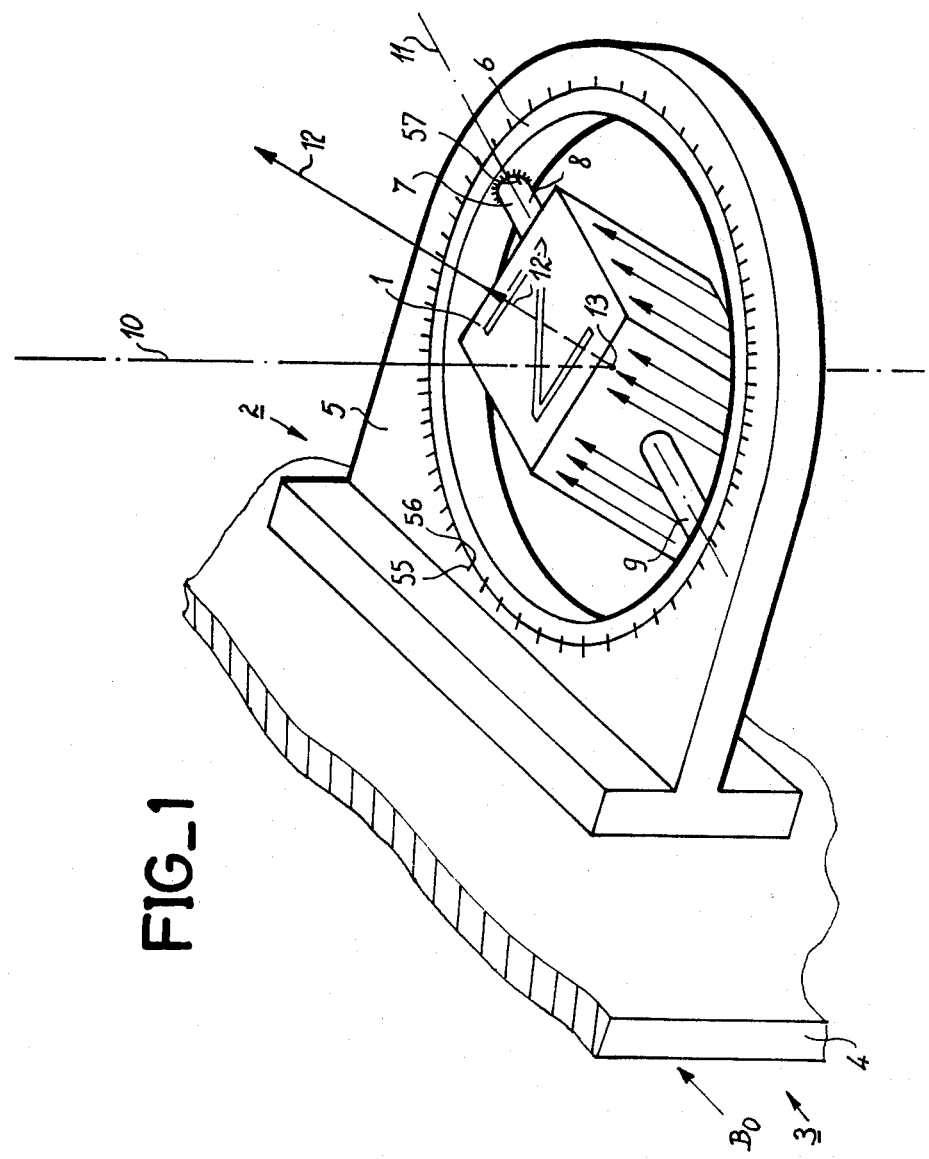
FIG_1

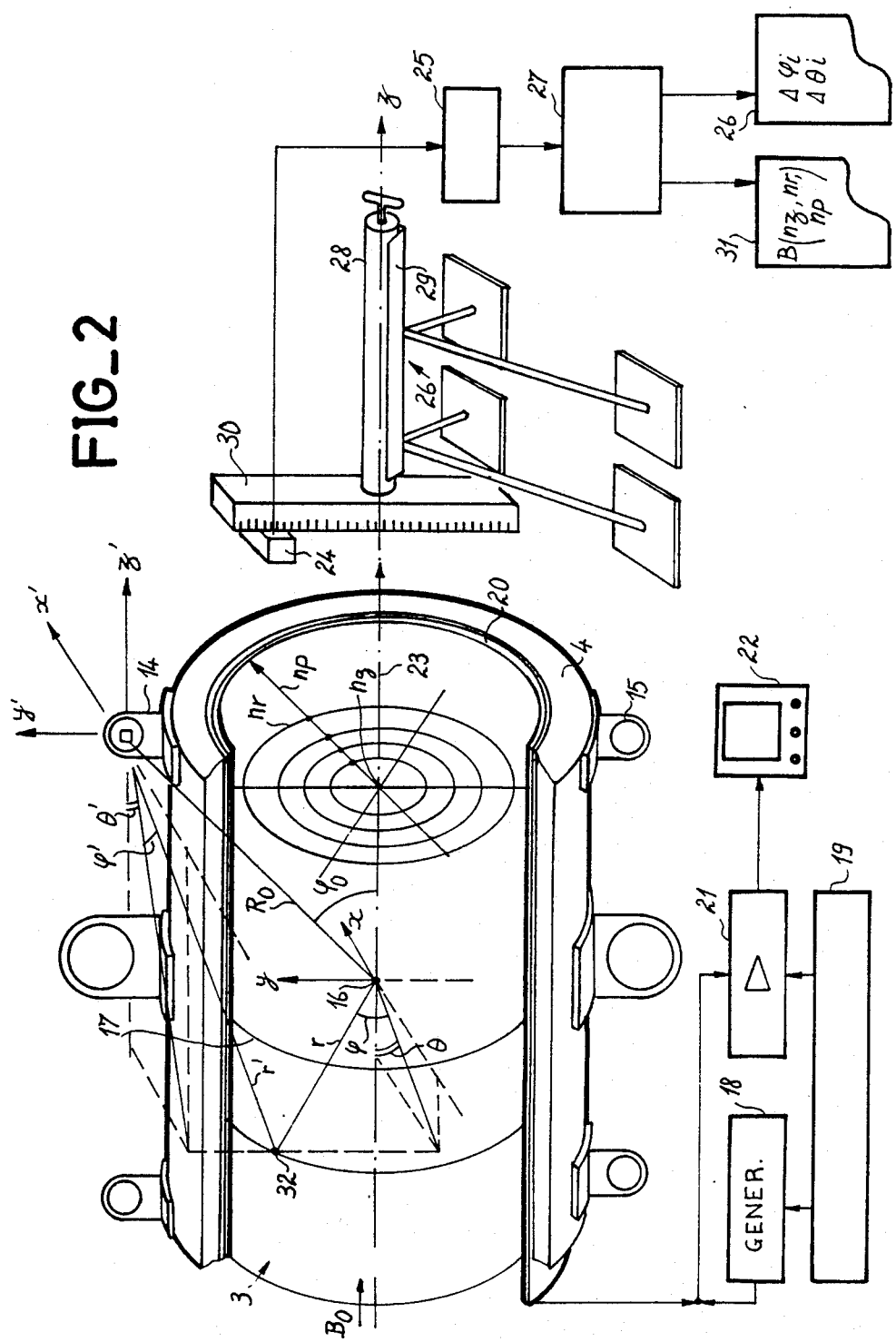
FIG_2

BLOCK FOR CORRECTING MAGNETIC-FIELD HOMOGENEITY AND A MAGNET FITTED WITH BLOCKS OF THIS TYPE

BACKGROUND OF THE INVENTION

1. Field of the Invention

The present invention relates to a homogeneitycorrecting block for adjusting and correcting the magnetic field produced by a magnet. The invention also provides a magnet equipped with blocks of this type. A primary application of this invention is in the medical field in which magnets are employed for performing noninvasive investigations by nuclear magnetic resonance (NMR) imaging techniques. However, the invention has potential applications in other areas of activity, particularly for scientific research in which intense fields produced by magnets are employed.

2. Description of the Prior Art

Magnetic resonance is a phenomenon of oscillation of the magnetic moment of nuclei of atoms or molecules of a body at a frequency depending on the intensity of a magnetic field in which the body is placed. It is accordingly apparent that, if the intensity of the magnetic field varies, the frequency of the resonance phenomenon also varies. In experimentations of this type, it is consequently of primary importance for both technological and technical reasons to ensure that the field produced by the magnet is very homogeneous in its zone of interest. The requisite degree of homogeneity is commonly of the order of a few parts per millions in the medical field or even a few parts per billions in the scientific field. In order to achieve this objective, it is endeavored to construct magnets which produce a field having perfect homogeneity.

Unfortunately, no matter how much care may be devoted to the construction of magnets, the final products are never as perfect as the theory which has led to their design. Furthermore, even if this shortcoming can be completely overcome, the magnet still has to be materially placed at a predetermined location in order to be put to use. There is, however, no region in the earth's atmosphere either in an industrial or in an urban environment which is totally free from disturbing magnetic influences. The result is that, once a magnet is installed at its site location, the field produced in the zone of interest of the magnet exhibits inhomogeneities and an effort then has to be made to correct them.

The principle involved in correction of field inhomogeneities is that of superposition: coils, magnetic parts or any other means for producing magnetic fields are added in order to correct imperfections of the main field and in order to produce a homogeneous total field. In an article by Messrs. D.I. Hoult and D. Lee entitled "Shimming a superconducting nuclear-magneticresonance imaging magnet with steel" and published in the January 1985 issue of Rev. Sci. Instrum., pages 131 to 135, a method is described for correcting the magnetic field produced by a magnet. In accordance with this method, magnetizable soft iron bars are placed in such a manner as to exert their influence in a zone of interest of the magnet. The degree of this influence depends on the size of the bars: as their cross-section is larger, so the efficiency of correction is higher. However, this method suffers from a drawback: the magnetic parts employed have to be cut in accordance with strict dimensional requirements for each application. Furthermore, taking into account the complexity of the correction theory, the authors lay down as a postulate for the purpose of simplifying their solution that the magnetic elements can be placed only at predetermined locations with either radial or annular orientations within the magnet. As a result, correction of the field produced by a magnet cannot be performed either readily or satisfactorily unless correcting bars are manufactured and positioned in accordance with requirements.

SUMMARY OF THE INVENTION

The present invention proposes to solve the problem of adjustment of the field of a magnet in a different manner. Magnetic correcting blocks of given intrinsic efficiency are fixed on supports in proximity to the field to be corrected. The supports for these blocks are accordingly distinguished by the fact that they are orientable. It is thus possible to modify the contribution of the magnet to the magnetic field produced within the zone of influence of said blocks. These magnetic correcting blocks are pieces of permanent magnet having a high coercive field and high anisotropy (magnets having a base of rare earths, for example) which are sufficient to ensure that their magnetization is not appreciably modified by the prevailing field at the location at which the blocks are placed. Moreover, the orientable supports of the invention are provided with pointing graduations for quantizing the correction. The correction proper is preferably performed in accordance with a method of adjustment described hereinafter.

Accordingly, the invention is directed to a magnetic correcting block for adjusting homogeneity of the magnetic field produced by a magnet, said block being maintained in proximity to the field to be adjusted by a support which is essentially provided with means for adjusting the orientation of the block. A further object of the invention is to provide a magnet fitted with blocks of this type.

BRIEF DESCRIPTION OF THE DRAWINGS

FIG. 1 illustrates an orientable magnetic correcting block in accordance with the invention.

FIG. 2 illustrates one example of utilization of a block in accordance with the invention in a nuclear magnetic resonance (NMR) imaging device.

DESCRIPTION OF THE PREFERRED EMBODIMENTS

FIG. 1 illustrates a block of permanently magnetized magentic material which is securely held in position by a support 2 and produces a magnetic field at any point of its environment. The support 2 is moved to a zone of interest 3 in which a magnetic field $B_O$ prevails and is to be modified or corrected. In one example, the volume of interest 3 is located within an assembly 4 for producing the field $B_O$. The assembly 4 can be an arrangement of electric coils of all types including the Bitter type. However, the field $B_O$ can also be produced by any other means, in particular by pole-pieces of permanent magnet material and the support 2 is accordingly attached to a structure 4 placed around the zone of interest 3 of said magnet.

One particular feature of the invention relates to the orientable nature of the magnetic shim 1 within the support 2. In the representation of FIG. 1, the support 2 is made up of a support member 5 proper, an orientable intermediate member 6 and a fixing member 7 which is also orientable. The member 6 has one degree of freedom in rotation with respect to the member 5. Similarly, the member 7 is free to rotate with one degree of freedom with respect to the member 6. In accordance with a preferred arrangement shown in this embodiment, the axes of rotation 10 and 11 of the members 6 and 7 are orthogonal or even in strictly perpendicular relation. The intermediate member 6 is rotatably mounted for sliding motion within the support member 5 by means of a bearing. By way of example, the outer ring of this bearing is secured to the support member 5 and the inner ring is secured to the intermediate member 6. The fixing member 7 can be designed in the form of two separate stub shafts 8 and 9 respectively, said stub shafts being placed in end-to-end relation and aligned on two opposite faces of the block 1. At their opposite ends, the stub shafts 8 and 9 are maintained within the intermediate member 6 by means of two bearings.

In a preferred manner, the axes of rotation 10 and 11 are perpendicular and intersect at the point 13 of the center of gravity of the block 1. In a preferred embodiment, the largest dimension of the block 1 is smaller than the internal diameter of the intermediate member 6. The result thereby achieved is that the orientation 12 of the magnetic moment of the block 1 is capable of assuming any predetermined orientation with respect to the field $B_O$. As a function of its preferred orientation 12, the magnetic block 1 can be represented as having a north pole N and a south pole (not shown in the drawings). The lines of force of the field produced by the block 1 leave this latter at its north pole and enter at its south pole. Along these lines of force, the field produced by the block 1 varies in value and in orientation according to a distribution which can be known when the shape and magnetization of the block are known. The support member, intermediate member and fixing member of the block are provided with index marks 55 to 57 which pass in front of each other at the time of adjustment. These index marks serve to measure the pointing angles. Moreover, friction means or locking means can be added in order to maintain the orientation of the block after adjustment and thus to guard against any disturbance of adjustment.

The schematic view in perspective of FIG. 2 illustrates one example of a nuclear magnetic resonance (NMR) imaging device of the type employed in the medical field. A magnet 4 produces an intense field $B_O$ within the volume of interest or enclosure 3, the shape of which is that of a circular cylinder. A generator 18 controlled by a unit 19 are provided for supplying an instrument 20 for radiofrequency excitation and spatial differentiation of the magnetic moments of the nuclei of atoms and molecules of the body which is placed for examination within the enclosure 3. Particularly in regard to its radiofrequency excitation function, the instrument 20 is also employed for measuring a de-excitation wave which is representative of the magnetic resonance phenomenon. Said instrument 20 is connected to a receiver unit 21 for receiving and processing the measured signal. Said receiver unit 21 is also controlled by the control unit 19 and is capable of producing cross-sectional images of the body under examination. These images can be visualized on a display device 22.

Adjustment of orientation of the blocks in this example will now be described. A magnetic field $B_O$ which is as homogeneous as possible is produced within the internal zone of interest 3 by means of the assembly 4. If perfect homogeneity is not achieved within said zone 3, this may be corrected in accordance with the invention by means of a predetermined number of magnetic blocks. By way of example, these blocks can be placed at the external periphery of the field-producing assembly 4. In order to simplify positioning of the blocks, it may prove useful to provide a series of machined locations in the structure 4 so as to permit rapid fixing of the blocks. Furthermore, the blocks can have different sizes or magnetizations.

It is possible by measuring the field $B_O$ at all points of the volume 3 to provide an analytical expression of the field in the following form:

$$\frac{B_z(r,\theta,\phi)}{B_s} = H_0 + \sum_{n=1}^{\infty} \left(\frac{r}{r_o}\right)^n [H_n P_n(\cos\theta)] +$$

$$\sum_{n=1}^{\infty} \left(\frac{r}{r_o}\right)^n \left[\sum_{m=1}^{m=n} I^m{}_n \cos m\phi \sqrt{\frac{(n-m)!}{(n+m)!}} \ P^m{}_n(\cos\theta)\right] +$$

$$\sum_{n=1}^{\infty} \left(\frac{r}{r_o}\right)^n \left[\sum_{m=1}^{m=n} J^m{}_n \sin m\phi \sqrt{\frac{(n-m)!}{(n+m)!}} \ P^m{}_n(\cos\theta)\right]$$

In this formula, $B_z$ is the component, along the axis 23 of the circular cylinder structure, of the field $B_O$ created by the magnet 4; $B_s$ is a reference field for defining the dimensionless coefficients $H_n$, $I_n{}^m$ and $J_n{}^m$. The reduced radius $r/r_O$ measures the modulus of the distance r from any point of the volume of interest to the radius $r_O$ of a useful sphere. The functions $P_n(\cos\theta)$ and $P_n{}^m(\cos\theta)$ are the Legendre polynomials respectively of order n and of degree m. The coefficients $H_n$, $I_n{}^m$ and $J_n{}^m$ are representative of the field $B_O$ and are known in the case of a measured field $B_z$. In practice, a computer 27 can be programmed for performing this computation of coefficients $H_n$, $I_n{}^m$, $J_n{}^m$ of the analytical expression on the basis of the measurements. Moreover, it is wholly possible to determine the correspondence which exists between the spherical coordinates r, $\theta$, and $\phi$ of the points in the analytical expression and cylindrical coordinates which can serve at the time of measurement of the field.

These cylindrical coordinates represent in particular the various positions which may be assumed by a probe 24 connected to a gaussmeter 25 when it is displaced by means of a scanning device 26 within the volume 3. In very general terms, the scanning device 26 includes a shaft 28 which is capable of sliding and rotating about its own axis within a bearing 29. The shaft 28 is aligned with the axis 23 of the circular cylindrical volume 3. At the end of the shaft 28 is mounted a transverse graduated scale 30 on which the probe 24 can be fixed. Depending on the rotational position of the shaft 28, the scale 30 is oriented in one among np possible directions. The height of the position of the probe 24 on the scale 30 can be taken from nr possible positions. Finally, the shaft 28 is capable of sliding within the support 29 so that the probe can be located successively at nz levels along the axis 23. The gaussmeter 25 can be connected directly to the computer 27. This latter can edit a list 31 of measured values of the field and compute the coefficients of the analytical expression.

Since the position of a block and the orientation of its magnetic moment are known, it is possible to compute the analytical expression of the field which it creates. In accordance with the teachings of the patent Application cited earlier, it is proposed to combine algebraically analytical expressions of the field correction means so as to produce a so-called correction analytical expression. This correction analytical expression is representative of a correction field which, when associated with the real field, converts this latter to a desired ideal field. The parameters which are applicable to adjustment of the correction means are deduced from the results of this algebraic composition.

The same applies to the correcting blocks in accordance with the invention. The adjustment applies to the number and to the position of the blocks, to the orientation and to the magnitude of their magnetic moment. Consider by way of example a correcting block 14, the position of which is characterized by the spherical coordinates $R_O$, $\theta_O$, $\phi_O$ with respect to the frame of reference 16,x,y,z. The moment of its block having a magnitude M has an orientation characterized by the angles of the spherical coordinates $\theta_1$ and $\phi_1$ with respect to the frame of reference x',y',z' located at 14 and deduced by the translation $R_O$, $\theta_O$, $\phi_O$ of the reference frame 16. The field created in the zone of interest by the correcting block has an analytical expression in accordance with the general form given earlier with coefficients $H_n$ $_{cor}$, $I_n^m$ $_{cor}$, $J_n^m$ $_{cor}$ function of M, $\theta_1$, $\phi_1$, $R_O$, $\theta_O$, $\phi_O$. Accordingly, it is possible to program a computer in order to determine the minimum number $N_{min}$ of necessary correcting blocks with their parameters of magnitude of the moment (M), or orientation ($\theta_1$, $\phi_1$) and of position ($R_O$, $\theta_O$, $\phi_O$) so as to produce a magnetic field which, when superimposed on the original field of the magnet 4, comes as close to the desired ideal field as may be required. The program also takes into consideration the following additional requirements by way of preference:

M equal to a value selected from a predetermined set, thus enabling an operator to choose from a range of alternative blocks in much the same manner as a set of marked weights is available for carrying out a weighing operation;

$R_O$, $\theta_O$, $\phi_O$ corresponding to one of the positions predetermined by the machined locations provided for receiving the connectors.

On the other hand, in accordance with the preferred arrangement of the invention, the orientation ($\theta_1$, $\phi_1$) of the magnetic moment can be adjusted without any constraint by means of the support shown in FIG. 1. The program to be composed makes conjoint use of two processing operations. In the first place, it permits analytical computation of the field produced by the block. One example of a computing operation of this type is described in the article by F. Romeo and D.I. Hoult published in "Magnetic Resonance in Medicine" (1984) 1, 44–65 and entitled "Magnet Field Profiling: Analysis and Correction Coil Design".

In addition, this program for computing $N_{min}$ and the values M, $\theta_1$, $\phi_1$, $R_O$, $\theta_O$ and $\phi_O$ must perform a processing operation which involves minimization of functions. The problem of minimization of a nonlinear function of a number of variables with constraints is classical and perfectly solved by iterative calculations by means of a computer. Programs known as "routines" which are capable of successfully carrying out these minimization processes are available in the majority of "libraries" associated with a scientific computing center. It is possible, for example, to make use of the EO4UAF routine of the "Numerical Algorithms Group" library of British origin. Programming of the analytical expressions given earlier for carrying out the routine is accordingly within the capacity of anyone who is conversant with this field.

These correctors may be employed in combination with correcting coils through which currents are passed or with soft iron parts placed within the magnet. The most effective, efficient and economic combination will be determined by those versed in the art.

What is claimed is:

1. A magnetic correcting block for adjusting homogeneity of the magnetic field produced by a magnet, said block being maintained in proximity to the field to be adjusted by a support, wherein said support is provided with means for adjusting the orientation of the block wherein the means for adjusting the orientation of the block include means for orienting the block in all directions; and wherein the means for adjusting the orientation include an intermediate member which is orientable with respect to the support in directions contained in a first plane which is fixed with respect to said support, and a fixing member which is orientable with respect to the intermediate member in directions contained in a second plane which is fixed with respect to said intermediate member.

2. A block according to claim 1, wherein the magnet is provided with coils surrounding an internal volume of interest, and wherein the support is attached to the external surface of said coils.

3. A block according to claim 1 or 2, wherein the intermediate member has a ring which is placed flatwise in the first plane.

4. A block according to claim 1 or 2, wherein the fixing member includes a shaft diametrically arranged within the ring and wherein said shaft is composed of two stub shafts placed in end-to-end relation and located in alignment with each other on each side of the block.

5. A block according to claim 1 or claim 2, wherein said block is formed by a piece of permanent magnet.

6. A block according to claim 5, wherein the value of magnetization of said piece of magnet has been selected from a finite set of predetermined values.

7. A block according to claim 1 or 2, wherein one of the intermediate member and the fixing member are provided with graduated index marks to be displaced in front of graduated index marks provided respectively on one of the support and the intermediate member.

8. A magnet fitted with at least one block according to claim 1 or claim 2.

9. A magnet according to claim 8, wherein said magnet is provided with a set of pre-machined locations for receiving the block.

* * * * *